United States Patent
Kuriyama et al.

(10) Patent No.: US 6,510,404 B1
(45) Date of Patent: Jan. 21, 2003

(54) GATE DELAY CALCULATION APPARATUS AND METHOD THEREOF USING PARAMETER EXPRESSING RC MODEL SOURCE RESISTANCE VALUE

(75) Inventors: Shigeru Kuriyama, Hyogo (JP); Michio Komoda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 480 days.

(21) Appl. No.: 08/915,079

(22) Filed: Aug. 20, 1997

(30) Foreign Application Priority Data

Mar. 4, 1997 (JP) .............................. 9-049086

(51) Int. Cl.[7] .......................... G06G 7/48; G06F 17/50; G06F 7/60
(52) U.S. Cl. .................... 703/6; 703/2; 703/13
(58) Field of Search .................. 395/500.07; 703/2, 703/6, 13

(56) References Cited

U.S. PATENT DOCUMENTS

| | | | |
|---|---|---|---|
| 5,475,605 A | | 12/1995 | Lin |
| 5,515,291 A | * | 5/1996 | Omori et al. ............... 364/488 |
| 5,559,715 A | * | 9/1996 | Misheloff ................... 364/488 |
| 5,841,672 A | * | 11/1998 | Spyrou et al. .............. 364/488 |

FOREIGN PATENT DOCUMENTS

JP  5-108753  4/1993

OTHER PUBLICATIONS

Lee et al.: A Reliable Traversal Clock Delay Evaluation Including Input Slew Effect with 3D Parasitic Interconnect RLC Extraction; IEEE May 1997 Custom Integrated Circuits Conference; pp. 123–126.*

Kayssi et al., Analytical transient response of CMOS inverters, IEEE Trans. Ckts & Sys., pp. 42–45, Jan. 1992.*

"Performance Computation for Precharaterized . . ."Florentin Dartu et al., IEEE Transactions on Computer–Aided Design of Integrated Circuit and Systems, vol. 15. No. 5, May 1996, pp. 544–533.

* cited by examiner

*Primary Examiner*—Hugh M. Jones
(74) *Attorney, Agent, or Firm*—McDermott, Will & Emery

(57) ABSTRACT

A gate delay calculation apparatus includes an $R_s$ parameter storage file for prestoring a parameter for expressing a source resistance value of an RC model as a continuous time function, an $R_s$ determination portion for selectively extracting the parameter prestored in the $R_s$ parameter storage file from the amount of input waveform gradient and output load model and a gate delay determination portion for calculating gate delay based on the source resistance value expressed by the parameter extracted by $R_s$ determination portion and the output load model.

6 Claims, 10 Drawing Sheets

GATE DELAY CALCULATION APPARATUS AND METHOD THEREOF USING PARAMETER EXPRESSING RC MODEL SOURCE RESISTANCE VALUE

BACKGROUND OF THE INVENTION

1. Field of the Invention

The present invention relates to an apparatus and a method for calculating gate delay used in logic simulation and timing analysis, and in particular, to an apparatus and a method for calculating gate delay using an RC model.

2. Description of the Background Art

Recently, the higher integration and multifunction of a semiconductor integrated circuit are increasing its circuit scale, thereby making the time required for its development longer. One method of reducing the time required for the development is to minimize re-designing and re-development due to the malfunction of a produced semiconductor integrated circuit. To achieve this goal, the simulation result obtained in a stage of designing a semiconductor integrated circuit must approximate to the timing of a signal between the gates within an actually produced semiconductor integrated circuit, and therefore there is an increasing need for a delay calculation apparatus with higher accuracy.

FIG. 1 is a block diagram showing a structure of a conventional delay calculation apparatus. The delay calculation apparatus includes: an input waveform gradient calculation apparatus 51 for extracting the gradient of the input waveform applied to an input terminal of a gate; an output load model calculation apparatus 52 for RC modeling the load applied to an output terminal of the gate; a gate delay calculation apparatus 53 for calculating the delay experienced from the input terminal to the output terminal of the gate; and a wire delay calculation apparatus 54 for calculating the delay (due to wiring) between the output terminal of the gate and the input terminal of a gate in a next stage. Gate delay data 55 calculated by gate delay calculation apparatus 53 and wire delay data 56 calculated by wire delay calculation apparatus 54 are used in logic simulation or timing analysis by a simulator or the like.

FIG. 2 is a schematic diagram showing an example of a circuit in which delay calculation apparatus calculates gate delay data 55 and wire delay data 56. The circuit includes gates (inverters) 41–44 and wires 45–50 between the gates. The processing procedure of delay calculation apparatus will now be described with reference to the circuit diagram shown in FIG. 2.

The delay in a logic circuit is generally calculated from the delay of gates per se (gate delay data 55) and the delay resulting from the wire capacitance between gates (wire delay data 56). Therefore, calculation of gate delay data 55 and wire delay data 56 (on the side of the output terminal of a gate) for every gate by delay calculation apparatus enables logic simulation and timing analysis by a simulator or the like. For example, assume that delay calculation apparatus calculates the delay for gate 42 shown in FIG. 2. First, input waveform gradient calculation apparatus 51 calculates the gradient amount of the voltage waveform applied to the input terminal of gate 42 based on the calculation result (gate delay data and wire delay data) of gate 41 in a preceding stage.

Wires 48–50 which carry the output voltage of gate 42 and the input of gates 43 and 44 are modeled by output load model calculation apparatus 52. This modeling will be described later.

Gate delay calculation apparatus 53 receives the amount of input waveform gradient calculated by input waveform gradient calculation apparatus 51 and the output load model calculated by output load model calculation apparatus 52, and calculates the gate delay between the input terminal and the output terminal of gate 42 to produce gate delay data 55. Gate delay calculation apparatus 53 also calculates the gradient of the output voltage waveform in gate 42 and transmits it to wire delay calculation apparatus 54.

Wire delay calculation apparatus 54 receives the output voltage waveform of gate 42 calculated by gate delay calculation apparatus 53 and the output load model calculated by output load model calculation apparatus 52 and calculates the wire delay between the output terminal of gate 42 and the input terminals of gates 43 and 44 to produce wire delay data 56.

FIG. 3 is a block diagram showing in further detail a structure of gate delay calculation apparatus 53 in FIG. 1. Gate delay calculation apparatus 53 includes: an $R_s$, $T_o$ parameter storage file 57 for storing a resistance value $R_s$ of source resistance and a fixed delay time $T_o$; an $R_s$, $T_o$ determination portion 58 for determining $R_s$ and $T_o$ which are required in gate delay calculation using parameters stored in $R_s$, $T_o$ parameter storage file 57; a gate delay determination portion 59 for calculating gate delay using $R_s$ and $T_o$; and an input waveform determination portion 60 for calculating input waveform data 63 which is required for the calculation of wire delay by wire delay calculation apparatus 54. The amount of input waveform gradient 61 and an output load model 62 indicate the value calculated by input waveform gradient calculation apparatus 51 and that calculated by output load model calculation apparatus 52, respectively.

FIG. 4 is a diagram showing a structure of a π type RC model generally used as output load model 62. The π type RC model includes a source resistance 71 of a gate, a switch 72 for connecting the output terminal of the gate to a π type load, and a π type load consisting of capacitance elements 74 and 75 and a resistance element 73.

The processing procedure of gate delay calculation apparatus 53 will now be described with reference to a circuit diagram of a π type RC model shown in FIG. 4.

$R_s$, $T_o$ determination portion 58 determines resistance value $R_s$, of source resistance 71 and fixed time delay $T_o$ from the parameters stored in $R_s$, $T_o$ parameter storage file 57, the amount of input waveform gradient 61 and output load model 62. Fixed delay time $T_o$ represents the time at which switch 72 is turned from off to on and is significantly influenced by the amount of input waveform gradient 61. Therefore, fixed delay time $T_o$ is set as a parameter so that it can be determined from the amount of input waveform gradient 61 and stored in $R_s$, $T_o$ parameter storage file 57. It is noted that while resistance value $R_s$ may be defined as a constant value independent of input and output states, it can also be set as a parameter in consideration of the amount of input waveform gradient 61 and output load model 62 to achieve the higher calculation accuracy of the gate delay. In this case, output load model 62 is referenced. Thus, with reference to the amount of input waveform gradient 61, output load model 62 and the parameters stored in $R_s$, $T_o$ parameter storage file 57, $R_s$, $T_o$ determination portion 58 determines the resistance value $R_s$ of source resistance and the value of fixed delay time $T_o$.

It is noted that $R_s$, $T_o$ parameter varies depending on a gate type and rising/falling of output, and therefore it is set as a parameter in accordance with the gate type and the change in direction of output. In addition, rising of a gate means a state in which a power supply is connected to the upper terminal of source resistance 71 of π type RC model shown in FIG. 4, whereas falling means a state in which the upper terminal of source resistance 71 is grounded. Gate delay is calculated by gate delay determination portion 59 using resistance value $R_s$ and fixed delay time $T_o$ determined by $R_s$, $T_o$ determination portion 58 and output load model 62. Gate delay is calculated by analyzing π type RC model shown in FIG. 4. The resistance value R of resistance element 73 of π type RC model and the capacitance values C1 and C2 of capacitance elements 74 and 75 are determined from output load model 62 calculated by output load model calculation apparatus 52. In modeling the output load of gate 42 in FIG. 2, for example, capacitance values C1 and C2 and resistance value R are determined from the wire capacitance and impedance of wires 48–50 and the input capacitance of gates 43 and 44. The π type RC model is analyzed to calculate the output waveform v(t) of the gate in accordance with the following expression, where E represents a supply voltage.

$$v(t) = \qquad (1)$$

$$E\left[1 - \left\{\frac{r_1 - z_0}{r_1 - r_2}\exp(-r_1(t - T_0)) - \frac{r_2 - z_0}{r_1 - r_2}\exp(-r_2(t - T_0))\right\}\right](t > T_0)$$

wherein $$r_1 = \frac{1}{2}\left\{\left(\frac{1}{RC_1} + \frac{1}{RC_2} + \frac{1}{R_sC_2}\right) - \sqrt{\left(\frac{1}{RC_1} + \frac{1}{RC_2} + \frac{1}{R_sC_2}\right)^2 - \frac{4}{R_sC_1C_2}}\right\}$$

$$r_2 = \frac{1}{2}\left\{\left(\frac{1}{RC_1} + \frac{1}{RC_2} + \frac{1}{R_sC_2}\right) - \sqrt{\left(\frac{1}{RC_1} + \frac{1}{RC_2} + \frac{1}{R_sC_2}\right)^2 - \frac{4}{R_sC_1C_2}}\right\} z_0 = \frac{1}{RC_1} + \frac{1}{RC_2}$$

In the above expression (1), gate delay data 55 is obtained by finding the time at which output waveform v (t) equals the logic threshold voltage. That is, by solving v(t)=βE (0<β<1) for time t. 0.5 is commonly used for the value of β.

As described above, a conventional gate delay calculation apparatus 53 calculates gate delay using a π type RC model. In other words, resistance value $R_s$ is assumed to be infinite while switch 72 is off (up to fixed delay time $T_o$), whereas resistance value $R_s$ is assumed to be a fixed value $R_s$ determined by $R_s$, $T_o$ determination portion 58 while switch 72 is on (after fixed delay time $T_o$). The actual resistance value $R_s$ of source resistance of a gate is, however, a value which changes with time.

FIG. 5 is a diagram showing a relation between resistance value $R_s$ of source resistance and time t. A graph 81 shows a relation between resistance value $R_s$ of source resistance used by a conventional gate delay calculation apparatus 53 and time t. Resistance value $R_s$ is infinite up to fixed delay time $T_o$=1.0 ns, after which point it becomes a constant value. Furthermore, a graph 82 shows a relation between resistance value $R_s$ of source resistance of an actual gate and time t. As is apparent from graph 82, the source resistance of an actual gate is a prescribed value which is not infinite at time 0 ns and which gradually decreases with time.

FIG. 6 is a diagram showing a relation between output voltage v(t) of a gate and time t. A graph 83 shows a relation between the output voltage v(t) calculated by a conventional gate delay calculation apparatus 53 and time t. Output voltage v(t) is 0V up to fixed delay time $T_o$=1.0 ns, after which point it becomes a curve in accordance with expression (1). A graph 84 also shows a relation between output voltage v(t) of an actual gate and time t. As is apparent from graph 84, output voltage v(t) of an actual gate is a prescribed value at time 0 ns and it gradually increases with time.

The resulting difference between the change in the output voltage of an actual gate and that calculated by gate delay calculation apparatus 53 is caused by the following.

(1) In gate delay calculation apparatus 53, capacitance elements C1 and C2 of an π type RC model do not start charging until fixed delay time $T_o$. In an actual gate, however, charging starts at time 0 ns.

(2) Fixed delay time $T_o$ is set at the time at which the source resistance of an actual gate cannot be considered a sufficiently high value, and therefore the time which is earlier than the time at which the source resistance approximate to a constant value is set. As a result, resistance value $R_s$ after fixed delay time $T_o$ will be set larger than a constant value to which the source resistance of an actual gate approximate, so that the output waveform calculated by gate delay calculation apparatus 53 will be offset downward from that of an actual gate as the time proceeds. As a result, the time calculated by gate delay calculation apparatus 53 at which logic threshold voltage is attained will differ from that in an actual gate.

This problem may be solved, for example, by modeling $R_s$, $T_o$ such that the time calculated by gate delay calculation apparatus 53 at which logic threshold voltage is attained corresponds to that in an actual gate. However, a problem still remains in that the shape of the output waveform calculated by gate delay calculation apparatus 53 considerably differs from that in an actual gate, and therefore exact output waveform cannot be transmitted to wire delay calculation apparatus 54.

Another problem is that prior art approach cannot be used for a system which performs delay calculation using logic threshold as variable.

SUMMARY OF THE INVENTION

It is an object of the present invention to provide a gate delay calculation apparatus capable of enhancing calculation accuracy for gate delay data.

It is another object of the present invention to provide a gate delay calculation method capable of enhancing calculation accuracy for gate delay data.

In accordance with one aspect of the present invention, a gate delay calculation apparatus includes a $R_s$ parameter storage file for storing in advance a parameters which express the source resistance value of an RC model as a continuous time function, an $R_s$ determination portion for selectively extracting the parameters stored in the $R_s$ parameter storage file from the amount of input waveform gradient and an output load model, and a gate delay determination portion for calculating gate delay based on the source resistance value expressed by the parameters extracted by the $R_s$ determination portion and the output load model.

The gate delay determination portion calculates gate delay using the source resistance value expressed as a continuous time function by the parameters, and therefore it becomes possible to obtain a value which approximates to the gate delay calculated using an actual source resistance value.

In accordance with another aspect of the present invention, the gate delay calculation method includes the step of selectively determining the parameters which expresses the source resistance value of an RC model as a continuous time function from the amount of input waveform gradient and an output load model, and the step of calculating gate delay based on the source resistance value expressed by the parameters and the output load model.

Gate delay is calculated using the source resistance value expressed as a continuous time function by the parameters, and therefore it becomes possible to obtain a value which approximates to the gate delay calculated using an actual source resistance value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
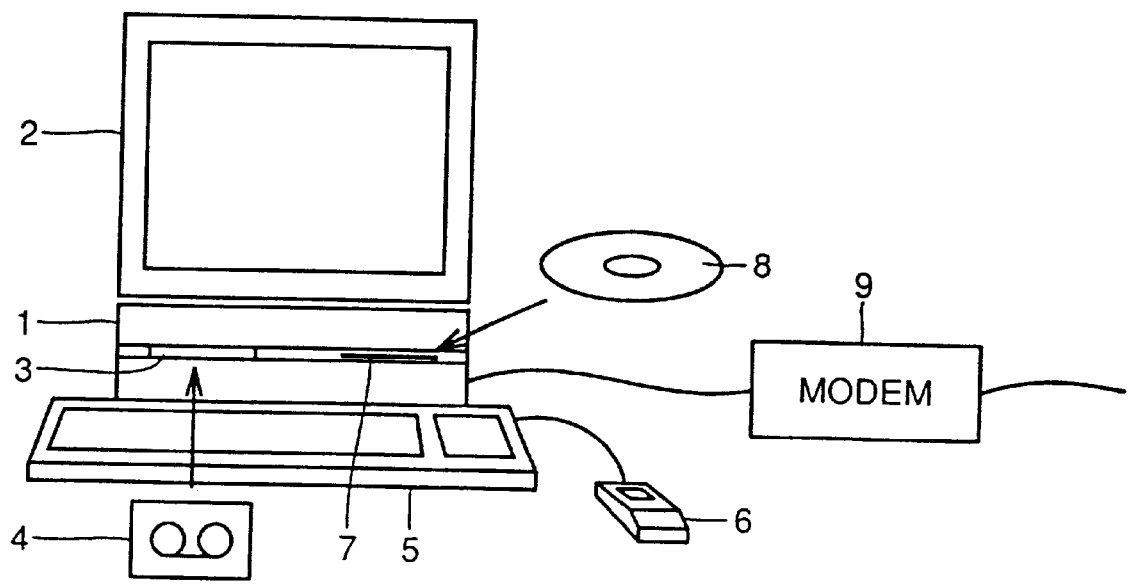
FIG. 7 is an illustration showing the appearance of a gate delay calculation apparatus of the present invention.

With reference to FIG. 7, a gate delay calculation apparatus includes a computer main frame 1, a graphic display unit 2, a magnetic tape unit 3 to which a magnetic tape 4 is attached, a keyboard 5, a mouse 6, a CD-ROM (Compact Disk-Read Only Memory) drive 7 to which a CD-ROM 8 is mounted, and a communication modem 9. As will be described later, a gate delay calculation program is provided by means of a storage medium such as a magnetic tape 4 or CD-ROM 8. The gate delay calculation program is executed by computer main frame 1 and an operator performs gate delay calculation by operating keyboard 5 or mouse 6 watching graphic display unit 2. The gate delay calculation program can also be provided to computer main frame 1 through communication modem 9 via the communication lines from other computers.

Figure 8:
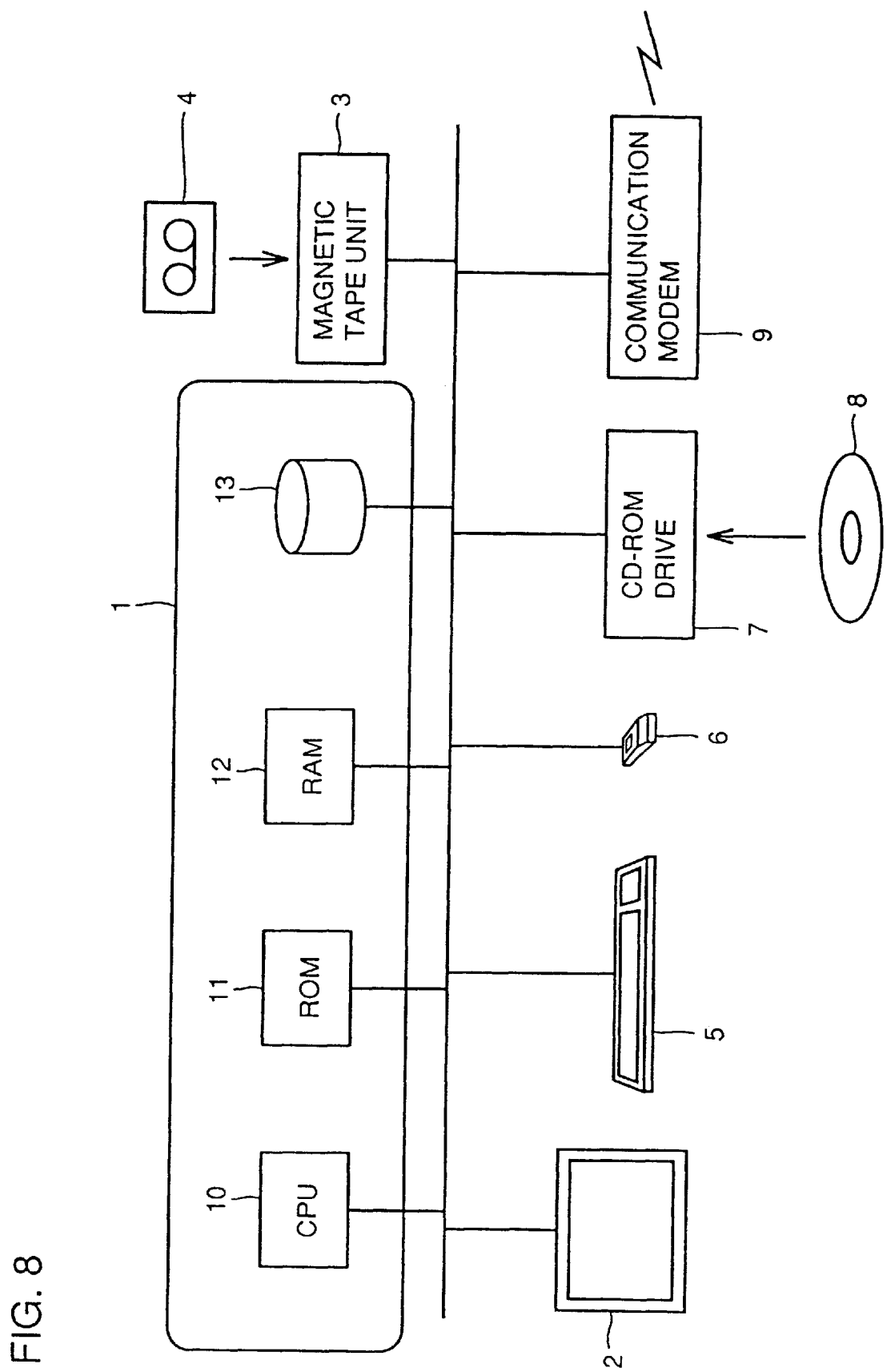
FIG. 8 is a block diagram showing a structure of a hardware of a gate delay calculation apparatus of the present invention.

With reference to FIG. 8, computer main frame 1 shown in FIG. 7 includes a CPU (Central Processing Unit) 10, an ROM (Read Only Memory) 11, an RAM (Random Access Memory) 12 and a hard disk 13. CPU 10 performs processing by inputting and outputting the data between graphic display unit 2, magnetic tape unit 3, keyboard 5, mouse 6, CD-ROM unit 7, communication modem 9, ROM 11, RAM 12 or hard disk 13. The gate delay calculation program stored in magnetic tape 4 or CD-ROM 8 is temporarily stored in hard disk 13 via magnetic tape unit 3 or CD-ROM unit 7 by CPU 10. CPU 10 performs gate delay calculation by loading the gate delay calculation program from hard disk 13 to RAM 12 to execute as needed.

Figure 9:
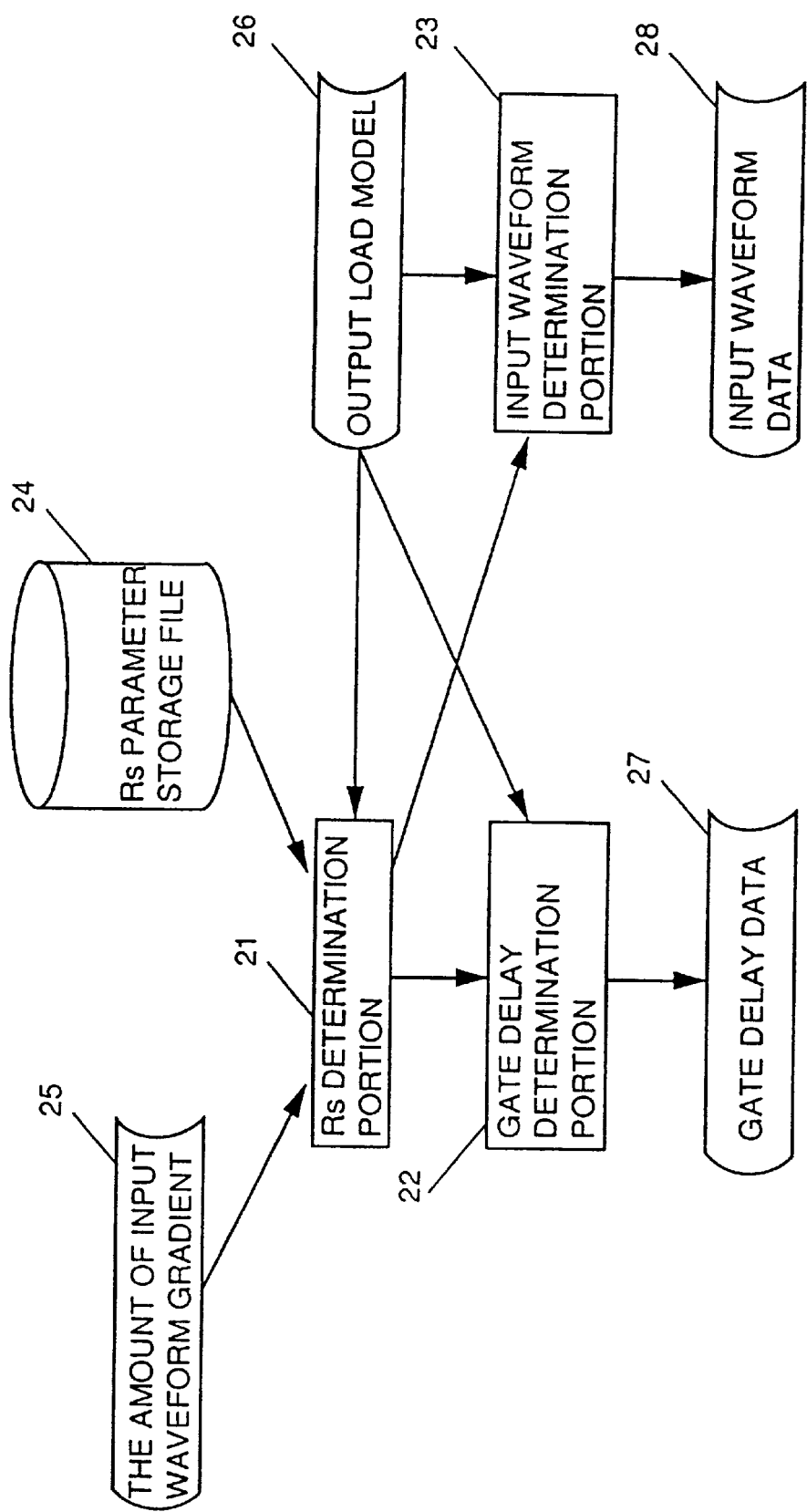
FIG. 9 is a block diagram showing a schematic structure of a gate delay calculation apparatus in accordance with an embodiment of the present invention.

With reference to FIG. 9, a gate delay calculation apparatus includes an $R_s$ parameter storage file 24 for prestoring the parameters which express a source resistance value $R_s$ as a function of time, an $R_s$ determination portion 21 for acquiring the parameters of source resistance value $R_s$ which are required in gate delay calculation from the amount of input waveform gradient 25 and an output load model 26 from $R_s$ parameter storage file 24, a gate delay determination portion 22 for calculating gate delay (block 27) from $R_s$ parameter and output load model 26, and an input waveform determination portion 23 for calculating an input waveform data 28 which are required when a wire delay calculation apparatus calculates wire delay.

Figure 1:
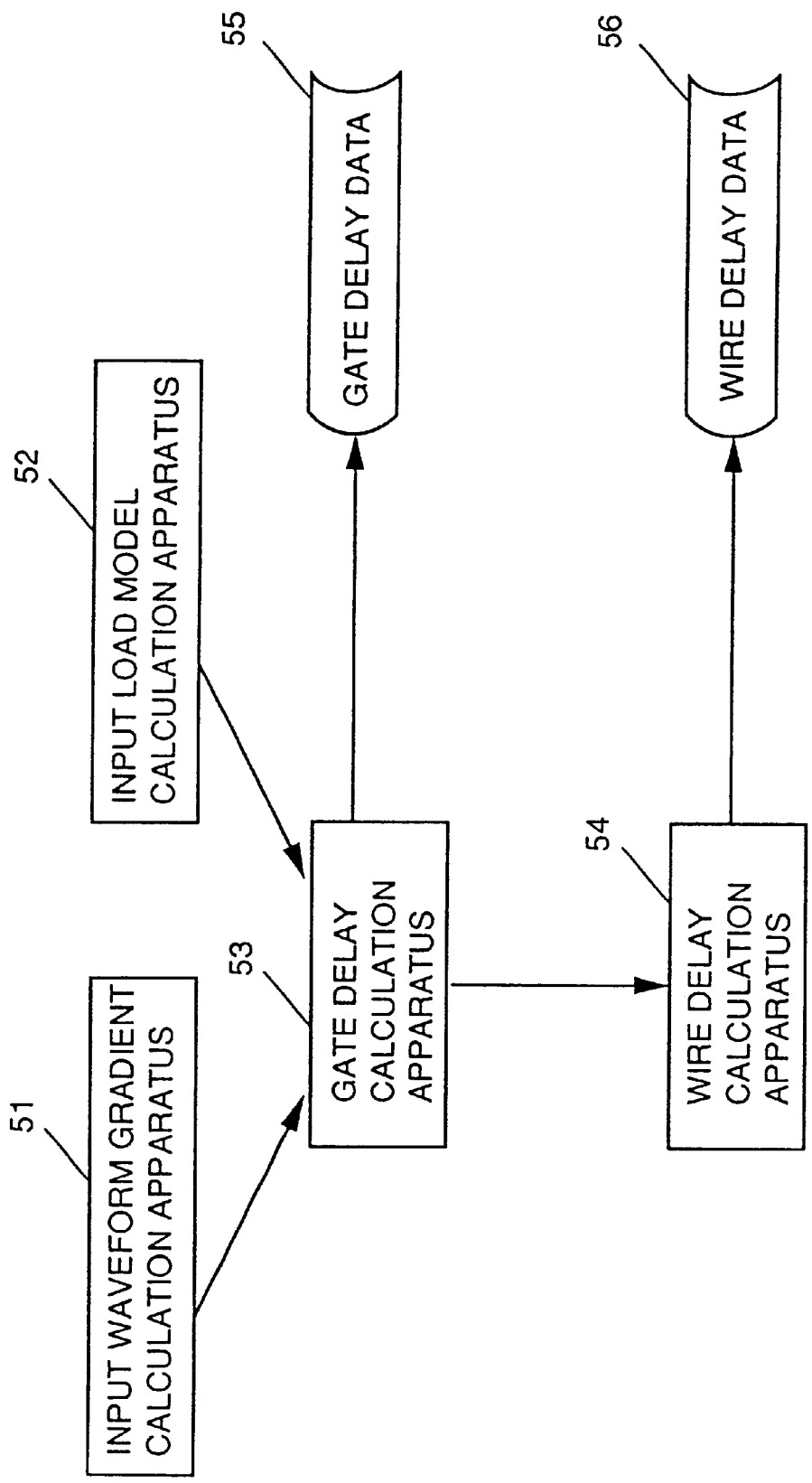
FIG. 1 is a block diagram showing a structure of a conventional delay calculation apparatus.
Figure 2:
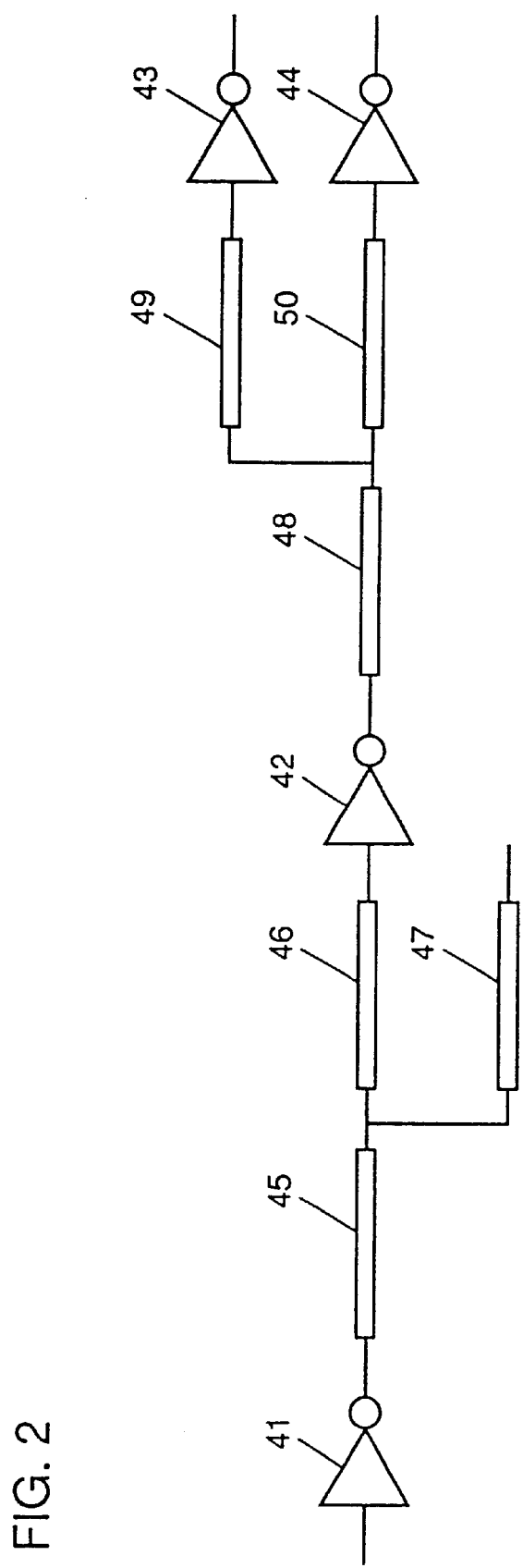
FIG. 2 is a schematic diagram showing an example of a circuit in which a delay calculation apparatus calculates gate delay data and wire delay data.
Figure 3:
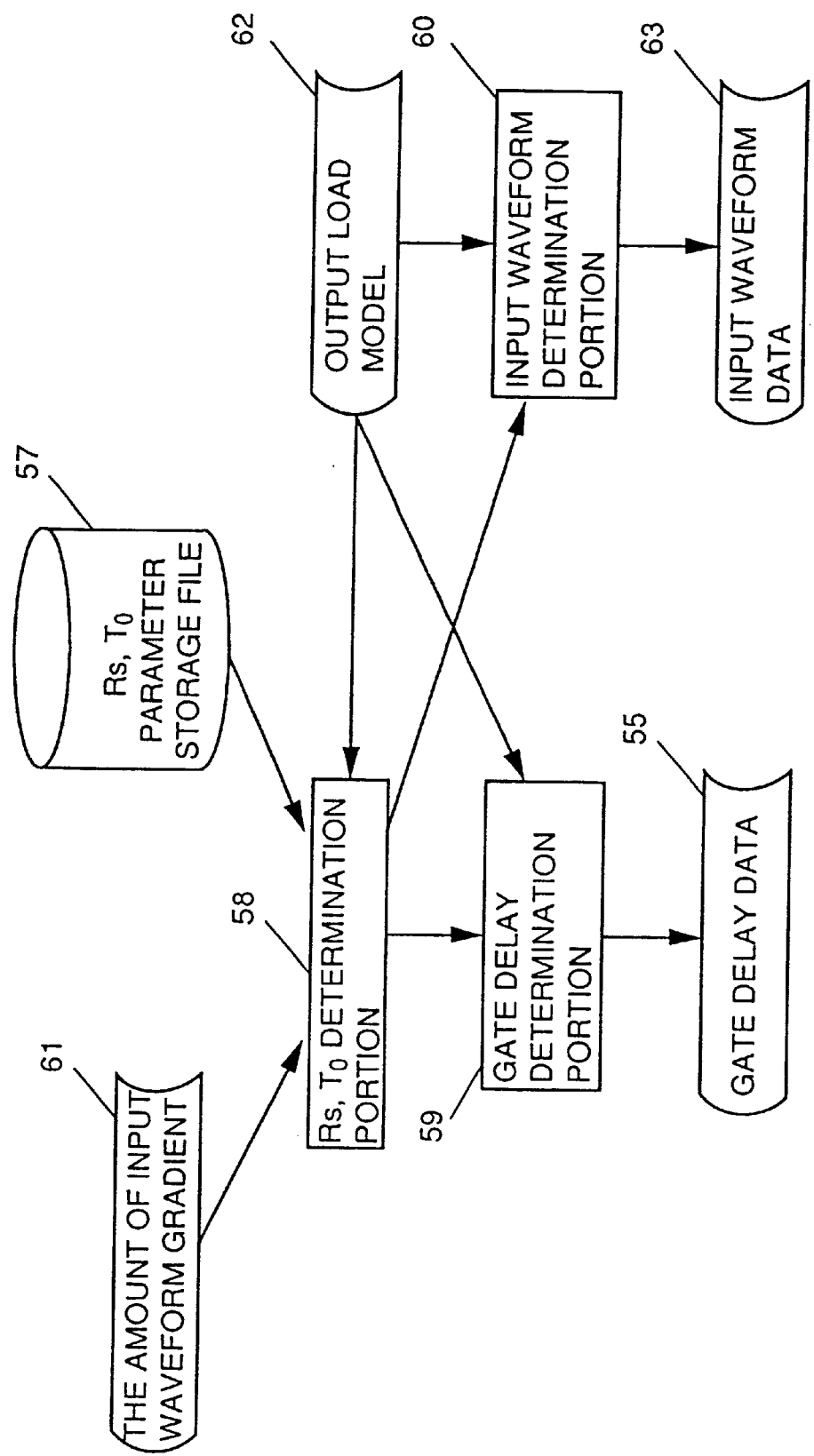
FIG. 3 is a block diagram showing in further detail a structure of a conventional gate delay calculation apparatus.
Figure 4:
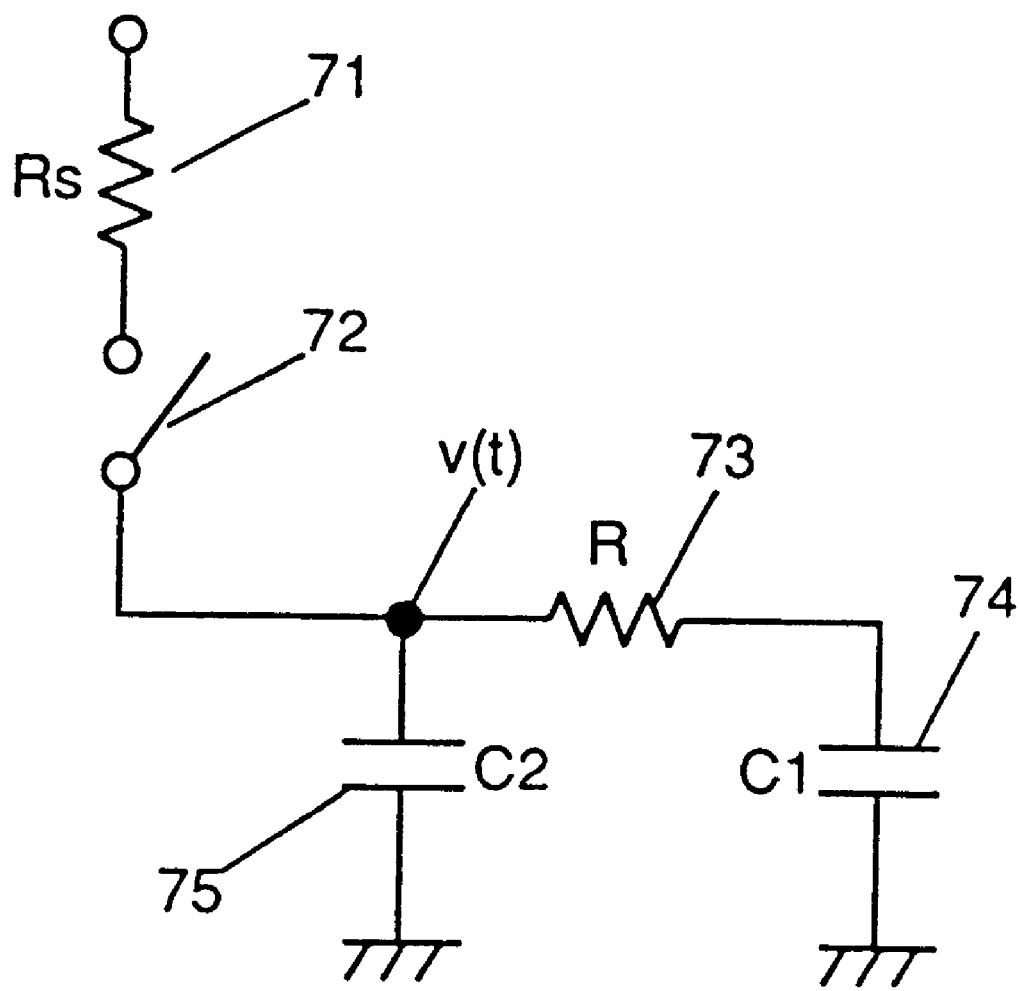
FIG. 4 is a diagram showing a structure of a π type RC model generally used as an output load model.
Figure 5:
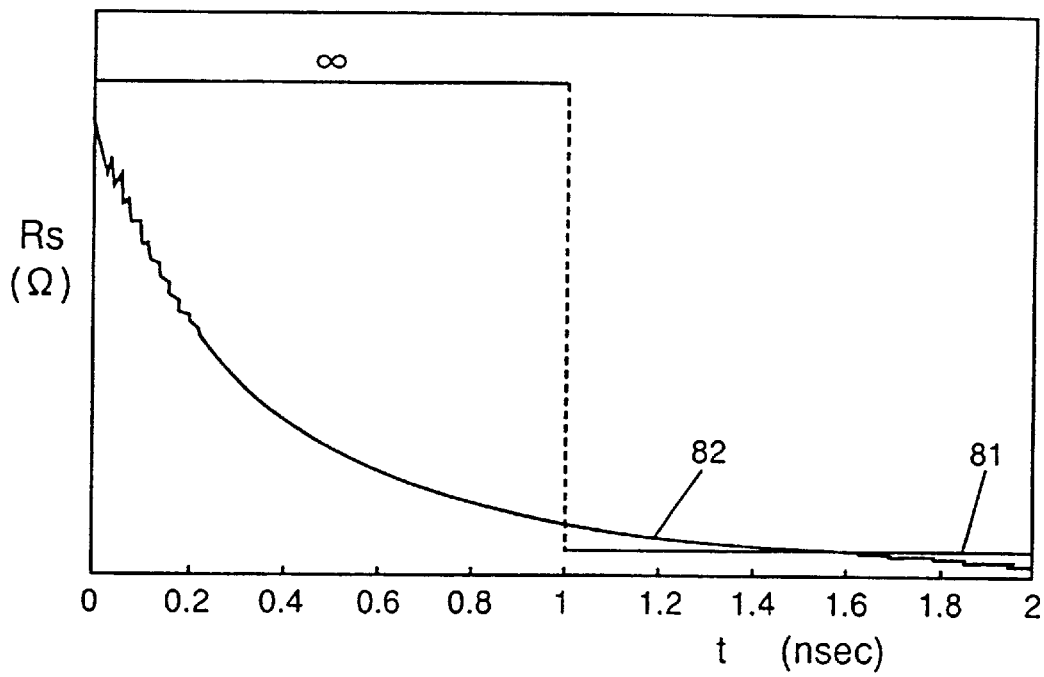
FIG. 5 is a diagram showing a relation between the resistance value $R_s$ of a source resistance and time t in a conventional gate delay calculation apparatus.
Figure 6:
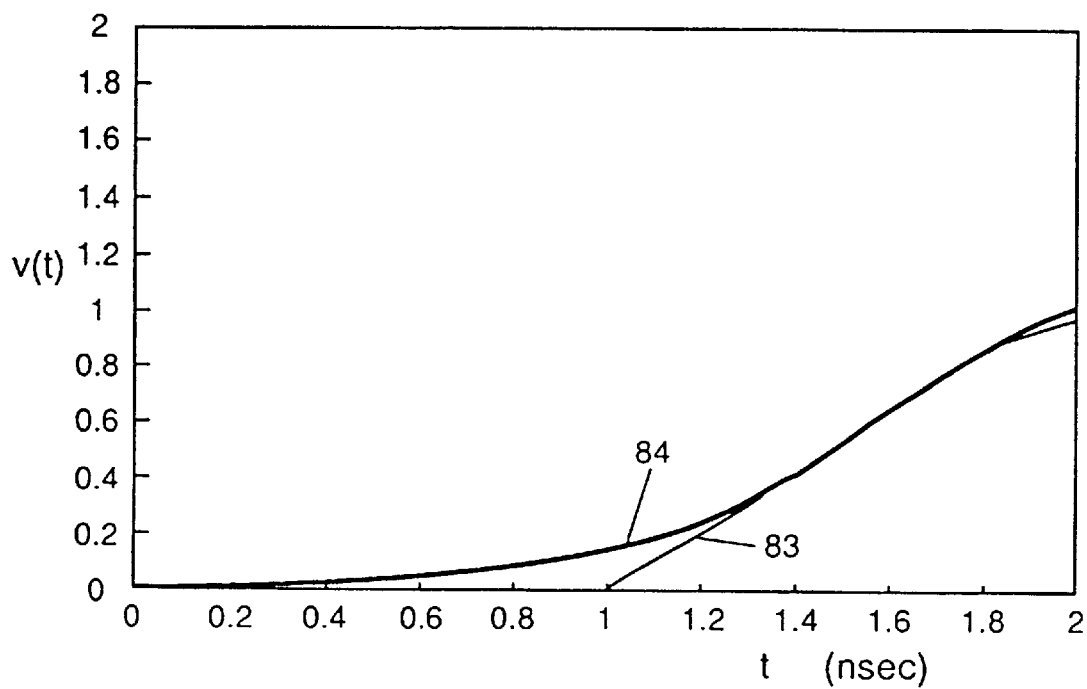
FIG. 6 is a diagram showing a relation between the output voltage v(t) of a gate and time t in a conventional gate delay calculation apparatus.
Figure 10:
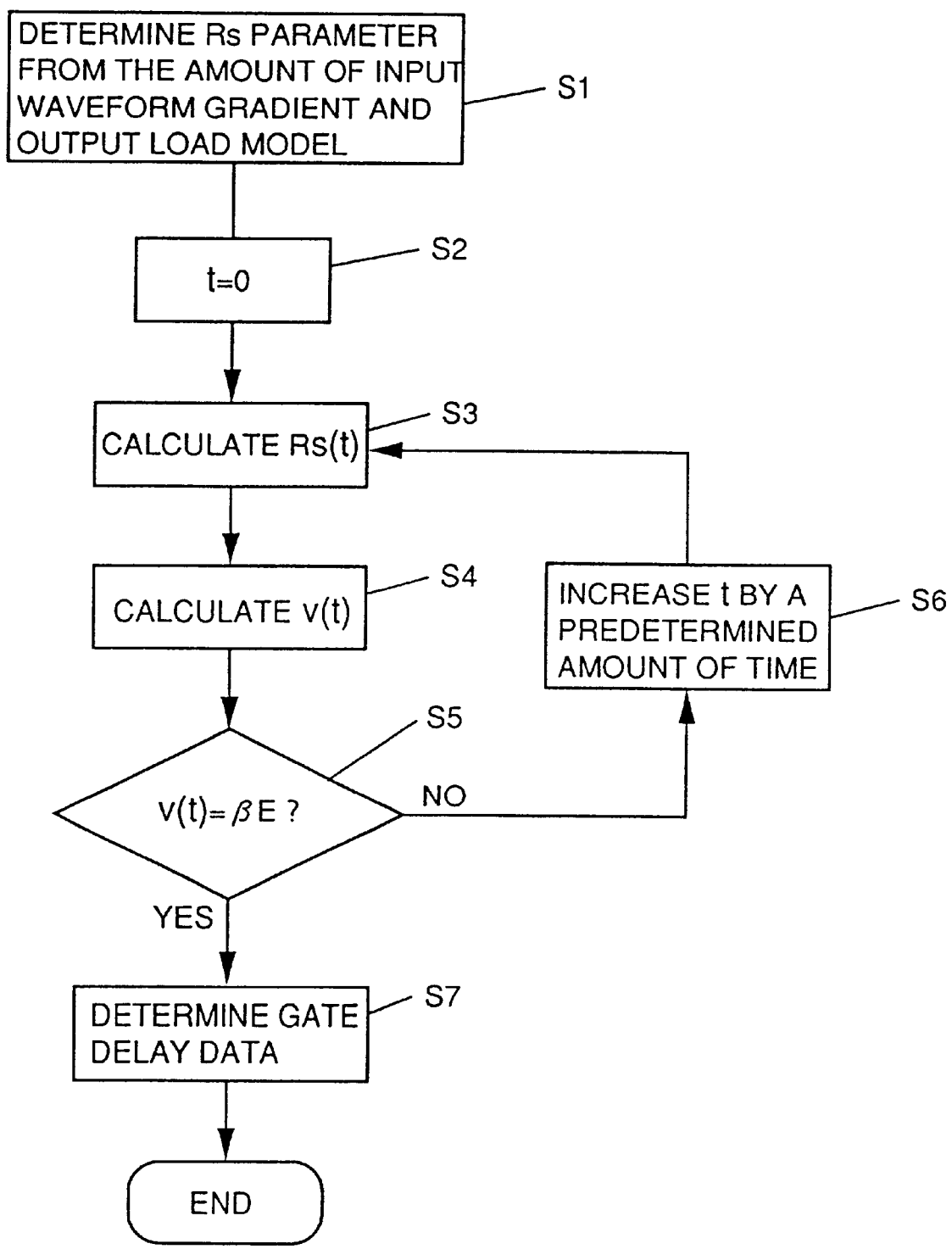
FIG. 10 is a flow chart showing the processing procedure of a gate delay calculation apparatus in accordance with the present embodiment.

With reference to FIG. 10, the processing procedure of a gate delay calculation apparatus will be described with reference to a circuit diagram of a π type RC model shown in FIG. 4. It is noted that a gate delay calculation apparatus in accordance with the present embodiment will be described assuming that a switch 72 of a π type RC model is always on (fixed delay time $T_o$ is always 0).

First, $R_s$ determination portion 21 determines the parameters of source resistance value $R_s$ (a value corresponding to the constant portion of a function of $R_s$) from the amount of input waveform gradient 25 and output load model 26, and reads from $R_s$ parameter storage file 24 (S1). The change in the source resistance value largely depends on the amount of input waveform gradient 25 and also differs according to the type of a gate and the rise/fall of the output, and therefore the constant portion of a function of $R_s$ is preset as a parameter and stored in $R_s$ parameter storage file 24 so that the change of the source resistance value can be determined from the amount of input waveform gradient 25 and output load model 26.

For example, the following relation of source resistance value $R_s$ can be obtained from the $R_s$ parameter.

$$R_s(t) = 3.378 \times 10^{-9} \times t^{-1.311} (0 \leq t < 2.5 \text{ ns}) \quad (2)$$

$$R_s(t) = -2.008 \times 10^{11} \times t + 1.569 \times 10^3 (2.5 \text{ ns} \leq t) \quad (3)$$

In this case, the five values of "$3.378 \times 10^{-9}$", "$-1.311$", "2.5 ns", "$-2.008 \times 10^{11}$" and "$1.569 \times 10^3$" in the above expressions (2) and (3) have been prestored as $R_s$ parameters in $R_s$ parameter storage file 24.

Gate delay determination portion 22 then substitutes "0" for time t (S2) and calculates $R_s(t)$ using the above expressions (2) or (3) (S3). Then, it calculates input waveform v(t) using the following expression. E represents power supply voltage.

$$v(t) = E\left[1 - \left\{\frac{r_1 - z_0}{r_1 - r_2}\exp(-r_1 t) - \frac{r_2 - z_0}{r_1 - r_2}\exp(-r_2 t)\right\}\right] \quad (4)$$

where r1, r2 and z0 are the same as those shown in the expression (1).

Gate delay determination portion 22 determines whether the valve v(t) calculated by the expression (4) is equal to βE (0<β<1) (S5). If it is not (S5, No), t is increased by a predetermined small amount of time (S6) and the following process is repeated by returning to step S3. If, v(t) is equal to βE (S5, YES), the current time t is determined as gate delay data (S7). 0.5 is commonly used for a value of β in calculating gate delay.

Figure 11:
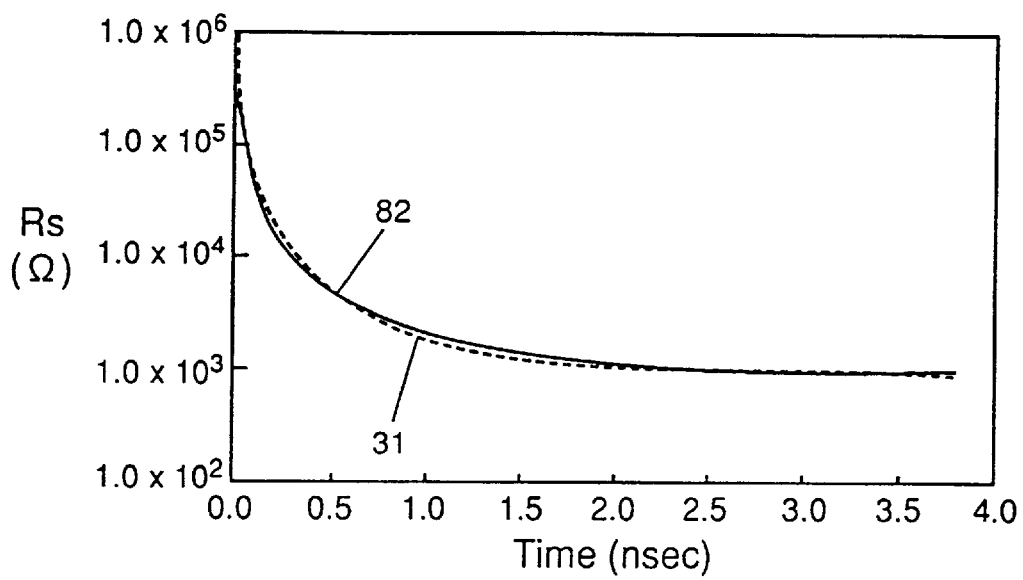
FIG. 11 is a diagram showing a relation between the source resistance value $R_s$(t) and time t calculated by a gate delay calculation apparatus in accordance with the present embodiment.

With reference to FIG. 11, it is apparent that a graph 31 representing $R_s(t)$ calculated by a gate delay calculation apparatus in accordance with the present embodiment significantly corresponds to a graph 82 representing an actual source resistance.

Figure 12:
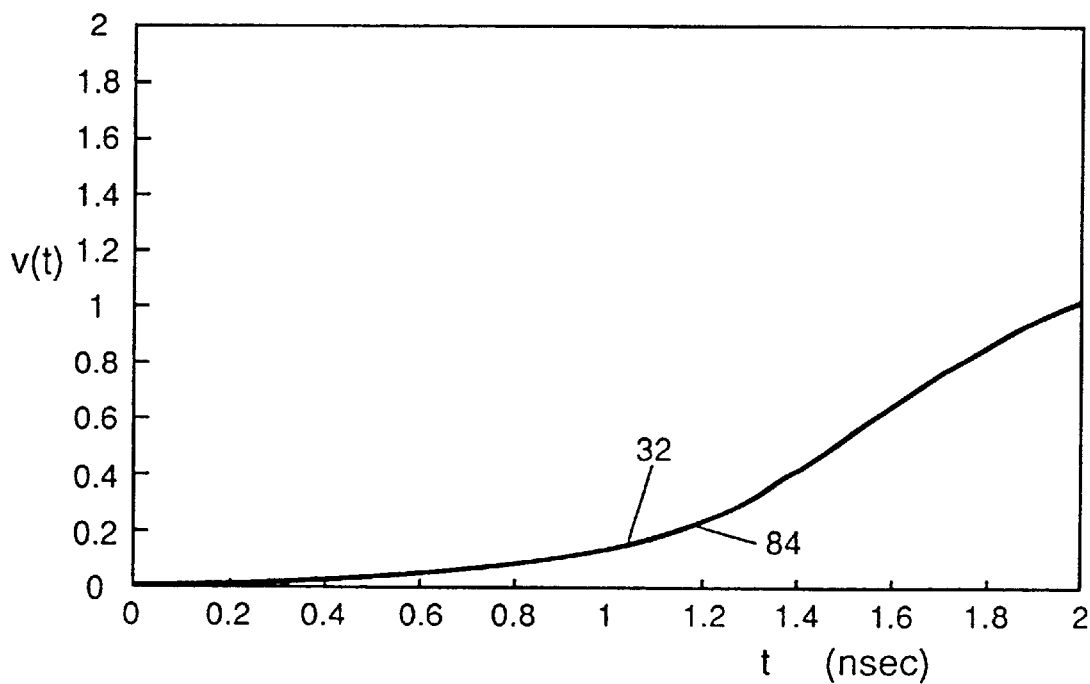
FIG. 12 is a diagram showing a relation between the output waveform v(t) and time t calculated by a gate delay calculation apparatus in accordance with the present embodiment.

With reference to FIG. 12, it is apparent that a graph 32 representing v(t) calculated by a gate delay calculation apparatus in accordance with the present embodiment significantly corresponds to a graph 84 representing the output waveform of an actual gate.

Input waveform determination portion 23 is capable of determining input waveform data 28 using the process shown in a flow chart of FIG. 10. That is, it determines gate delay data t1 using 0.1 for a value of β in step S5. Then, after determining the gate delay data t2 using 0.9 for a value of β in step S5, the difference between t2 and t1 is solved. This difference is defined as input waveform data. The solved input waveform data 28 is transmitted to a wire delay calculation apparatus by input waveform determination portion 23.

As described above, according to a gate delay calculation apparatus in accordance with the present embodiment, a source resistance value of an RC model can be calculated using parameters for expressing it as a time function, and therefore it well corresponds to the waveform of an actual source resistance value. Thus, calculation accuracy for gate delay is improved and the output waveform which well corresponds to an actual gate can be transmitted to a wire delay calculation apparatus.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A gate delay calculation apparatus comprising:
   storage means for prestoring in advance a parameter expressing a source resistance value of an RC model as a continuous time function;
   extract means for selectively extracting the parameter prestored in said storage means from an amount of input waveform gradient and an output load model; and
   gate delay determination means for calculating gate delay based on a source resistance value expressed by the parameter extracted by said extract means and said output load model.

2. The gate delay calculation apparatus according to claim 1, wherein said gate delay determination means calculates an output voltage based on the source resistance value expressed by the parameter extracted by said extract means and said output load model, and determines a time at which said output voltage attains a prescribed value as gate delay.

3. The gate delay calculation apparatus according to claim 1, further comprising input waveform determination means for determining an input waveform for a wire delay calculation apparatus based on the source resistance value expressed by the parameter extracted by said extract means and said output load model.

4. The gate delay calculation apparatus according to claim 3, wherein said input waveform determination means calculates an output voltage based on the source resistance value expressed by the parameter extracted by said extract means and said output load model, and determines a difference between a time at which said output voltage attain a first prescribed value and the time at which said output voltage attains a second prescribed value as an input waveform.

5. A gate delay calculation method comprising:
   the step of selectively determining a parameter expressing a source resistance value of an RC model as a continuous time function from an amount of input waveform gradient and an output load model;
   the step of calculating gate delay based on said source resistance value expressed by the parameter and said output load model; and
   the step of determining an input waveform for a wire delay calculation apparatus based on said source resistance value expressed by the parameter and said output load model.

6. The gate delay calculation method according to claim 5 wherein said step of determining input waveform includes:
   the step of calculating an output voltage based on said source resistance value expressed by the parameter and said output load model;
   the step of calculating a first time at which said output voltage attains a first prescribed value;
   the step of calculating a second time at which said output voltage attains a second prescribed value; and
   the step of determining a difference between said first and second times as an input waveform.

* * * * *